(12) United States Patent
Nettleton

(10) Patent No.: US 6,488,768 B1
(45) Date of Patent: Dec. 3, 2002

(54) METHOD AND APPARATUS FOR TREATING DISCHARGE GAS FROM A CZOCHRALSKI CRYSTAL GROWING CHAMBER UTILIZING WATER SPRAY

(75) Inventor: Rosemary T. Nettleton, Vancouver, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/907,408

(22) Filed: Jul. 17, 2001

(51) Int. Cl.[7] ............................................... C30B 15/20
(52) U.S. Cl. ......................................... 117/13; 117/208
(58) Field of Search .................................... 117/13, 208

(56) References Cited

U.S. PATENT DOCUMENTS

| | | |
|---|---|---|
| 4,239,734 A | 12/1980 | Ciszek |
| 5,004,519 A | 4/1991 | Hariri |
| 5,020,775 A | 6/1991 | Iwasaki et al. |
| 5,423,283 A | 6/1995 | Seki |
| 5,900,058 A | 5/1999 | Mizuishi et al. |
| 5,993,902 A | 11/1999 | Heid |
| 6,171,982 B1 * | 1/2001 | Sato ............................ 438/795 |
| 6,407,367 B1 * | 6/2002 | Ito et al. ..................... 219/390 |

* cited by examiner

Primary Examiner—Felisa Hiteshew
(74) Attorney, Agent, or Firm—Alston & Bird LLP

(57) ABSTRACT

A water spray subsystem apparatus and method of treating discharge gas designed for use in the gas discharge zone of a Czochralski crystal growing apparatus. The subsystem composes a structure containing or defining a water spray body, which is capable of providing a water spray into the discharge gas stream from the CZ chamber. The water is supplied into the discharge gas in the form of a spray or a mist in order to provide for intimate contact between the droplets of sprayed water and the discharge gas stream. Contacting the discharge gas stream with the water spray cools the gas stream, causes the reaction of SiO to $SiO_2$, and causes the precipitation of cooled $SiO_2$ and SiC out of the discharge gas stream.

31 Claims, 1 Drawing Sheet

METHOD AND APPARATUS FOR TREATING DISCHARGE GAS FROM A CZOCHRALSKI CRYSTAL GROWING CHAMBER UTILIZING WATER SPRAY

FIELD OF THE INVENTION

The present invention relates to a discharge gas treatment apparatus and method for use with a crystal growing chamber utilizing the Czochralski method, such invention comprising a water spray apparatus capable of limiting the amount of Si compounds released into the atmosphere while avoiding safety hazards related to unwanted siphoning of water into the Czochralski chamber.

BACKGROUND OF THE INVENTION

As industry drives demand for ever larger and higher quality crystals for use in microchip fabrication, crystal growers embrace an ever increasing body of technology which enables them to make crystals of increasing size and at an increasing rate. However, very real safety concerns still plague crystal growers as the techniques of today still require the control of potentially hazardous chemicals within a harsh high-temperature environment. Though hazardous waste streams produced during crystal growth are handled adequately by technology of today during its normal operation, the possibility of equipment failure mixed with the potentially extreme consequences of such an event could still be improved.

The majority of crystals today, particularly silicon crystals, are grown using the Czochralski method, known simply as the CZ method. In the CZ method, polycrystalline material is placed within a crucible along with any necessary dopants or other additives. The crucible, in turn, is placed within a closed chamber capable of being isolated from the atmosphere. Because of the extreme heat necessary for crystal production the primary components within a CZ chamber are typically graphite, with the exception of the crucible which is typical quartz.

The polycrystalline material is then heated and melted at around 1400° C., after which a seed crystal having the desired orientation is placed just above the surface of the melted polycrystalline material, known as the melt. Because of surface tension, molten polycrystalline adheres to the lower surface of the crystal. As the molten polycrystalline along the lower surface of the crystal cools, it adopts the crystalline structure of the seed crystal. As the seed crystal is slowly raised within the Czochralski chamber, the crystal is grown as additional molten polycrystalline adheres to the crystal and solidifies with the proper crystalline orientation. The practice continues until a crystal of suitable size is achieved. Also, it must be noted that the CZ method usually involves constant rotation of the crystal and/or the crucible to counteract problems associated with non-uniform distribution of dopants and additives within the melt.

During the production of silicon crystals, various hazardous chemicals can be produced. Perhaps the most hazardous byproduct of high temperature crystal production is silicon oxide (SiO) which is believed to be produced by reaction of the polysilicon melt with the quartz crucible. The silicon oxide is violently reactive with oxygen to form $SiO_2$. Though oxygen is normally evacuated from the CZ chamber during the crystal growing process, the mere existence of SiO within the CZ chamber or within a gas discharge stream is cause for concern since any accidental breach of the CZ chamber during the crystal growing process would result in the potentially explosive oxidation of SiO.

Other byproducts of the crystal growing process are $SiO_2$, which is partially vaporized and may thereafter solidify above the melt, and SiC, which forms as a solid residue upon the graphite components of the CZ chamber, and may thereafter flake off into the area above and around the melt. Although $SiO_2$ and SiC are relatively non-reactive, they are undesired components within the CZ chamber because of their ability to cause buildup within the chamber or, worse, to contaminate the melt and destroy the crystallinity of the growing crystal.

In order to minimize the adverse impact of the hazardous chemicals, and further to inhibit the production of the undesired byproducts discussed above, the CZ chamber is filled with an inert gas. Furthermore, crystal growth typically occurs under a slight vacuum.

In practice, the CZ chamber is repeatedly evacuated and supplied with inert gas as each crystal is produced. For instance, to insert a seed crystal within the CZ chamber, the chamber must necessarily be exposed to the atmosphere. After the seed crystal is put in place, the chamber is evacuated through use of a vacuum pump. Once the chamber has been evacuated, inert gas is supplied to the chamber, which is still under a slight vacuum. As the crystal growing process begins and continues, inert gas is continuously supplied to the chamber and continuously removed from the chamber through use of another vacuum pump. After the crystal has grown, the gas supply and discharge are closed, the chamber is opened to the atmosphere to allow access to the crystal, the melt is replenished if necessary, a new seed crystal is inserted, and the process is repeated.

The gas discharged from the chamber carries with it the various byproducts of the reaction, including SiO, $SiO_2$, and SiC. As mentioned above, SiO is a potentially explosive component which is particularly dangerous when held in a hot, dry gas stream. The other components are also environmentally regulated and must be removed from the discharge stream before it is exhausted to the environment or otherwise reused.

Conventional discharge gas treatment methods often use a water bubbler to oxidize the SiO under controlled wet conditions, to solidify the $SiO_2$ and SiC components of the gas stream, and to cool the discharge gas. Use of a water bubbler involves discharging the contaminated gas stream into a water filled tank. After the discharge gas enters the tank, the gas is rapidly cooled as the gas rises through the water. As the gas is cooled, a large percentage of the $SiO_2$ and SiC precipitates out of the gas stream and falls to the bottom of the water bubbler, where it may be collected. The SiO within the gas stream reacts, in a controlled manner, with the oxygen present in the water to form $SiO_2$, which precipitates to the bottom of the bubbler. The remaining gas stream is removed from the bubbler, still under slight vacuum, and either exhausted to the atmosphere or treated further.

Under normal operating conditions, the bubbler arrangement works quite well for removing contaminants from the gas stream. However, the CZ apparatus is operated at extreme temperatures and byproducts of the process, particularly $SiO_2$, tend to solidify and readily form deposits within the discharge system which includes piping, vacuum pumps, and valves. Having $SiO_2$ deposits throughout the gas discharge system creates a likelihood that a vacuum pump will fail or that a valve will be unable to close during crystal growth. Furthermore, the gas discharge system including the vacuum pump and the valves may fail for some other reason. Given that the crystal growing process is conducted under a vacuum, it is possible that, due to equipment failure, water from the water bubbler could be siphoned back through the gas discharge system, perhaps invading the vacuum pump or even the CZ chamber itself. The most likely cause of such siphoning would be failure of a discharge gas vacuum pump or failure of the vacuum seal between the gas discharge system and the CZ chamber during evacuation. A result of water backflow is at least destruction of the pump or the crystal being currently grown, and could perhaps result in a steam explosion caused by large quantities of water encountering the 1400° C. chamber atmosphere.

Previous attempts to overcome the problem of water backflow have involved various methods of mechanically and physically isolating the water bubbler from the CZ chamber and vacuum pumps. Two approaches to isolating the bubbler from the chamber are found in U.S. Pat. No. 5,900,058, which discloses the use of a buffer tank between the CZ chamber and the bubbler. The buffer tank is a gas filled tank located in-line with the gas discharge system, between the bubbler and the CZ chamber and any vacuum pumps. In theory, any water siphoned back into the discharge system would be captured by the buffer tank before it was able to make its way into pumps or the CZ chamber. The same patent also discloses use of a vacuum breaker device which would be able to sense loss of vacuum within the gas discharge zone of the Czochralski apparatus and which would quickly bring the CZ chamber to atmospheric pressure thereby stopping any siphoning from taking place.

Conventional safety devices have lowered the possibility of catastrophic equipment failure during crystal growing using a CZ chamber. However, the safety measures related to use of the water bubbler are far from failsafe. Rapid buildup of $SiO_2$ and SiC deposits within the gas discharge zone means that equipment failure can occur, including equipment failure of the safety equipment mentioned in the prior safety techniques.

It would, therefore, be desirable to provide an apparatus and method of preventing water backflow into a CZ apparatus upon vacuum pressure disruption, wherein such apparatus is not subject to the same disabling deposits and corrosive effects of the CZ environment which typically cause the disruption. In other words, an improvement in safety during discharge gas treatment with water is desirable which does not involve exposing the safety equipment to the same disabling environment which likely caused an equipment failure in the first place.

SUMMARY OF THE INVENTION

The present invention provides an apparatus and method of treating discharge gas from a CZ chamber which dramatically reduces the risks of water backflow associated with traditional water bubblers. The reduction of risk of water backflow is achieved by replacing the traditional water bubbler with a water spray subsystem within the gas discharge system of the CZ apparatus. The water spray subsystem provides adequate interaction between the discharge gas and the cooling, reacting water, so that the SiO in the gas stream reacts to $SiO_2$, and so that the $SiO_2$ and SiC are cooled and precipitated out of the gas stream. But, the water spray subsystem works without the necessity of a large accumulated volume of water that is maintained in communication with the CZ chamber, thus avoiding the possibility of water backflow and of all the catastrophic consequences related thereto.

The water spray subsystem is designed for use in the gas discharge zone of a Czochralski crystal growing apparatus. The subsystem composes a structure containing or defining a water spray body, which is capable of providing a water spray into the discharge gas stream from the CZ chamber. The water is supplied into the discharge gas in the form of a spray or a mist in order to provide for intimate contact between the droplets of sprayed water and the discharge gas stream. Contacting the discharge gas stream with the water spray cools the gas stream, causes the reaction of SiO to $SiO_2$, and causes the precipitation of cooled $SiO_2$ and SiC out of the discharge gas stream.

In an embodiment, the subsystem is composed of a closed vessel having a discharge gas inlet for receiving discharge gas containing various waste components, from the CZ crystal growing chamber, and a discharge gas outlet which allows the wetted, cooled, and reacted discharge gas to leave the vessel and continue to another treatment process or to exhaust into the atmosphere. The spray body is preferably located within the vessel and provides a water spray to the inside of the vessel. There is at least one drain to allow for the escape of water from the vessel.

The vessel preferably has an upper region and a lower region with the upper region having a central area and a periphery, such as a cylindrical tank having a vertical axis of orientation or a conical tank having a vertical axis of orientation. The gas inlets and outlets are disposed within the upper region of the vessel, so that condensing water from the spray body naturally falls away from and is not sucked into either the inlet or outlet. The water spray body is disposed about the periphery of the upper region of the vessel so that water sprayed into the vessel is projected inward and downward into the vessel. The spray body most preferably is composed of a series of spray heads which provide a very dispersed water spray having a wide spray pattern within the vessel. The condensed water, along with the particulates condensed out of the discharge gas, are removed from the vessel through a water outlet located in the lower region of the vessel.

In operation, discharge gas is projected downwards into the main volume of the vessel where it intimately contacts water which is likewise projected downward and inward into the main volume of the vessel. Upon contact of the discharge gas with the water, SiO reacts with oxygen present in the water to form $SiO_2$, and the $SiO_2$ and SiC within the gas stream are cooled and solidified, after which they fall to the bottom of the vessel. The cooled and reacted gas stream leaves the vessel through the gas outlet. The condensed water and particulates within the vessel settle to the bottom of the vessel, where they are removed through a water outlet.

By utilizing the water spray of the invention, adequate cooling and reaction of waste products within the discharge gas stream from the CZ chamber are provided.

Furthermore, use of the water spray and consequent lack of any large accumulated volume of water avoids the possibility of water being siphoned back into the CZ chamber in the event of an equipment failure. By eliminating the volume of water normally present in a bubbler, the present invention provides a dramatic improvement in safety by eliminating the possibility of water backflow into the discharge gas treatment system which has previously presented a hazard of mechanical destruction or steam explosion.

DETAILED DESCRIPTION OF THE INVENTION

Figure 1:
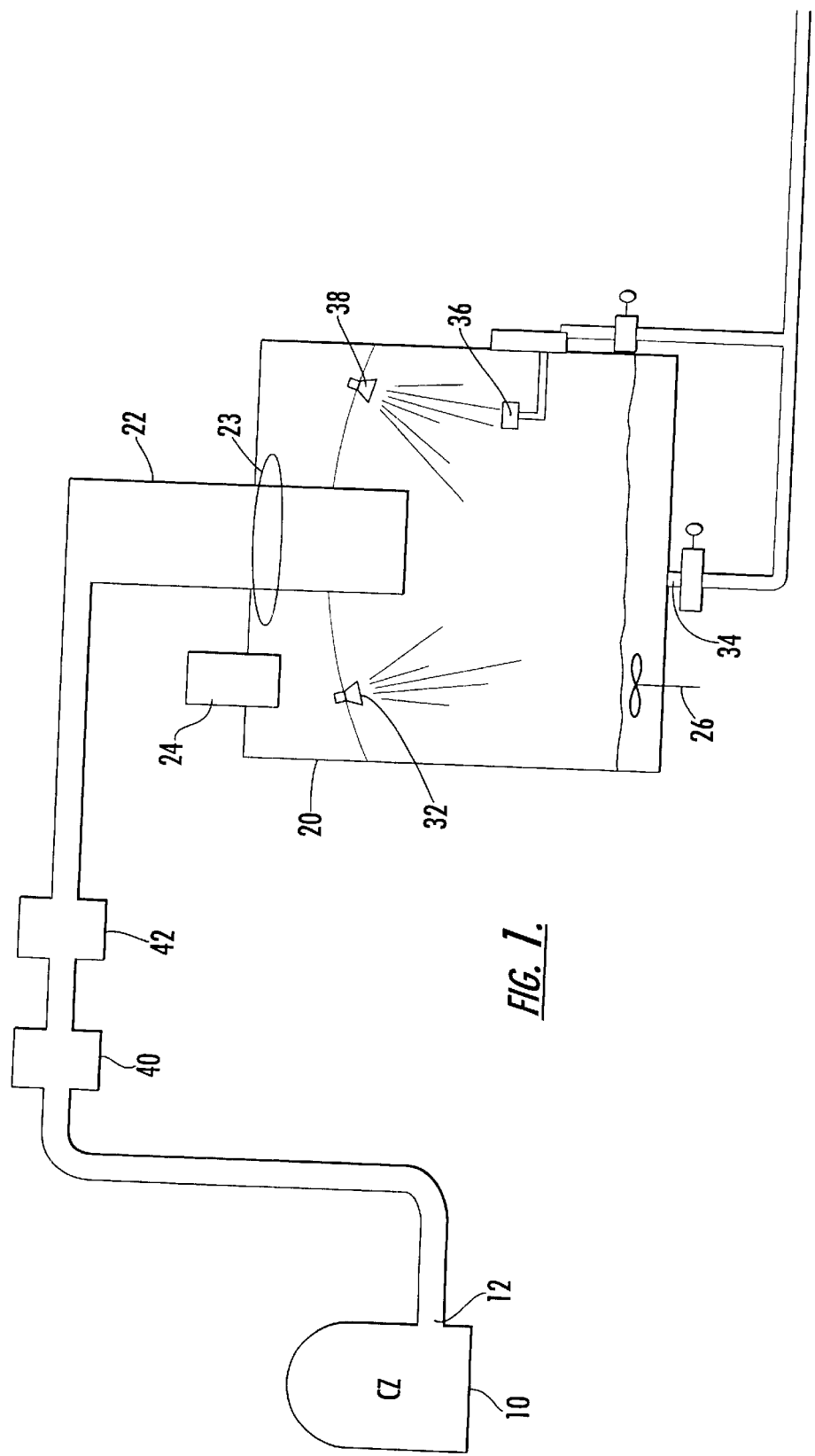
FIG. 1 is a schematic view of an example of the invented discharge gas treating apparatus.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In accordance with FIG. 1, an apparatus for treating discharge gas from a Czochralski crystal growing chamber is shown. In accordance with the invention, discharge gas from a Czochralski crystal growing chamber 10 is released into a duct 22 which carries the untreated discharged gas to a treatment vessel 20. The treatment vessel 20 has a water spray body 32 which is capable of dispersing water about vessel 20 from an upper region of the vessel 20. As the untreated discharge gas from the chamber 10 enters the treatment vessel 20, chemicals within the discharge gas react favorably with the dispersed water within the vessel 20. After treatment, the discharge gas exits the vessel 20 through gas outlet 24 for further treatment or exhaust. Water within the vessel, containing components from the treated discharge gas, is collected upon the bottom of the vessel 20 and released through a water outlet 34.

The Czochralski chamber 10 is any of a series of specially designed apparatus that are capable of growing silicon crystals. Typical Czochralski chambers contain a quartz crucible capable of holding polycrystalline material, and heating elements capable of heating the quartz crucible and the polycrystalline material to a temperature of approximately 1400° C., the temperature about which the polycrystalline material becomes a melt. Typical CZ chambers also contain means for suspending a seed crystal above the polycrystalline melt, as well as a means of slowly rotating the seed crystal and for the quartz crucibly with respect to one another.

The CZ chamber 10 in accordance with this invention has at least one gas inlet for a supply of inert gas during operation of the CZ chamber 10, and at least one gas outlet 12 for removal of the inert gas and other components that may be generated during operation of the CZ chamber from the inside of the chamber. Inert gas is supplied to the CZ chamber 10 during operation in order to surround the components and the reactants within the CZ chamber with an inert atmosphere. The inert atmosphere provided by the inhibits undesirable reactions within the chamber 10. Undesired products include SiO and $SiO_2$, which are products of the polysilicon contained within the crucible and residual oxygen within the CZ chamber 10. Another, less prevalent, product which is inhibited by the inert gas atmosphere is SiC, which is produced by the reaction of hot silicon with carbon from carbon containing components within the chamber 10. The volume of flowing through the CZ chamber and out of gas outlet 12 also acts as a vehicle to remove the SiO, $SiO_2$, and SiC contaminants from the ultrasensitive polycrystalline melt and silicon crystal formation taking place within the CZ chamber 10.

The contaminant filled discharge gas is carried away from CZ chamber 10 by piping 22, which carries the discharge gas to the treatment vessel 20. The CZ chamber 10, as well as the entire treatment apparatus, is typically held at a vacuum during production of silicon crystals. The discharge gas moves from the CZ chamber 10 to the treatment vessel 20 because of a pressure differential between the chamber 10 and vessel 20, most commonly due to a vacuum pump 42 in line with pipe 22 residing between the CZ chamber 10 and treatment vessel 20. Alternatively, vacuum or pressure differential is provided by pumps residing outside of the treatment apparatus. Other apparatus 40 in line with duct 22 between CZ chamber 10 and the vessel 20 preferably include, but need not include, supplemental safety equipment such as back float check valves, isolation valves, buffer tanks, and vacuum breakers.

The discharge gas conducted through piping 22 enters the treatment vessel 20 through a gas inlet 23. Though there is preferably a single gas inlet 23 located at a central region along the top portion of treatment vessel 20, the discharge gas could enter the treatment vessel through a plurality of gas inlets 23 in accordance with another embodiment of this invention. The discharge gas may enter the vessel 20 through a simple opening 23 within the top of the vessel, or more preferably through an extended portion of discharge gas piping 22 which extends into the vessel 20. The gas inlet 23 is located along an upper region of vessel 20 such that the gas inlet or gas piping 22 does not become submerged in residual water which may accumulate along the bottom of the treatment vessel 20. The gas inlet 23 is most preferably located on the top of the treatment vessel 20 such that the untreated discharge gases projected downward into the vessel 20 are dispersed about the entire volume of the vessel 20 before being removed by the gas outlet 24.

The vessel 20 is part of a water spray subsystem, which has a water spray body 32 capable of dispersing water within the treatment vessel 20. The water spray body 32 is preferably a series of piping connected to an external water source, which resides along the internal walls of the vessel 20 and is in communication with one or more nozzles 38. The nozzles 38 act to project and disperse water within the treatment vessel 20. Alternatively, the water spray body 32 may be located predominately outside the treatment vessel 20 with the nozzles 38 simply extending through the walls of the vessel 20. The number of nozzles 38 may practically range from one to any number more than one and is preferably four. The nozzles 38 may also be arranged in any manner to give adequate dispersion of water within the vessel 20, but are preferably evenly spaced about periphery of the upper region of the vessel 20. Preferably, the nozzles are arranged along the inner sidewalls and near the top of vessel 20, and aligned such that a finely dispersed volume of water is projected inward and downward, thus occupying the vast majority of the volume of vessel 20. In the embodiment shown in FIG. 1, the nozzles are shown projecting a volume of water downward upon extended piping 22 which extends into vessel 20 through gas inlet 23.

Water released from the nozzles 38 is preferably projected in a light to medium mist so that water droplets are smaller and more dispersed. The well dispersed water droplets interact more favorably with the discharge gas within the vessel 20. Spraying the water downward and inward within the vessel 20 acts as a safety measure to prevent large volumes of standing water or large volumes of sprayed water from being suctioned up extended piping 22 or out of gas inlet 23 in the event of a vacuum failure in operation of the CZ chamber 10 or gas treatment apparatus. A system of buffer tanks and/or check valves may optionally be disposed between the CZ chamber 10 and the vessel 20 as a backup system for preventing the backflow of any free volume of water from the vessel 20 to the chamber 10 or any pumps or similarly vulnerable equipment residing between the chamber 10 and the vessel 20.

The sprayed water within vessel 20 interacts with the untreated discharge gas within the vessel 20 and accomplishes those goals which have heretofore only been accomplished by gas bubblers, which bubbled untreated discharged gas through a volume of standing water. The first desired effect of the interaction of the sprayed water with the discharge gas is the oxidation of SiO to $SiO_2$ in a relatively controlled environment. The compound SiO is extremely hazardous because it reacts violently with oxygen to form $SiO_2$. Remember that the treatment vessel 20 is held in a vacuum just as the CZ chamber 10 and the other components of the treatment system. Limited amounts of oxygen are supplied to the vessel 20 as the dissolved oxygen naturally present in the water spray. The small amounts of oxygen provided by the water spray react with the SiO of the discharged gas in a controlled manner and neutralize the SiO to $SiO_2$.

The second goal accomplished by interacting the water spray with the discharge gas within the vessel 20 is the cooling and solidification of $SiO_2$ components within the discharge gas, and their subsequent removal from the discharged gas. The extreme temperatures of the CZ chamber 10, usually above 1400° C., cause $SiO_2$ produced within the CZ chamber 10 to vaporize and be carried from the CZ chamber 10 by the gas stream to the treatment vessel 20. The intimate interaction between the sprayed water and the discharge gas cools the discharge gas and its various components, including the $SiO_2$ component. Upon cooling, the $SiO_2$ is removed from the vapor phase and drops to the bottom of vessel 20 as a solid. Any SiC component within the discharged gas is also cooled and solidified and falls to the bottom of treatment vessel 20.

Water that has been sprayed into treatment vessel 20, and solids that have been removed from the discharge gas, are collected along the bottom of the treatment vessel 20. The water and solid slurry is removed by water outlet 34 in communication with the bottom of the vessel 20. It is preferred that water be supplied in a volume sufficient to dilute the solid components to an extent such that the liquid slurry flows freely from the vessel 20 through the water outlet 34. Alternatively, the vessel 20 is equipped with an agitator 26, which prevents the solid slurry from forming a cake on the bottom of vessel 20 and promotes the removal of the solids with the liquid leaving the vessel 20 through water outlet 34.

In operation of the treatment system, it is desired that the water slurry level within the vessel 20 be kept well below the gas inlet 23, the gas outlet 24, or any piping from the gas inlet or outlet extending into the vessel. This is done to prevent a volume of standing water from being suctioned back into the gas inlet 23 and therefore the CZ chamber 10, which could result in equipment damage and other safety hazards. As an additional safety measure, an alternative embodiment of the invention provides for an additional water outlet 36 positioned above the main water outlet 34, but below any of the gas inlets or gas outlets such that, in the event of failure of main drain 34, water and solid slurry material will be removed through secondary drain 36. Secondary drain 36 is preferably disposed within the sidewall of the vessel 20.

The discharge gas leaving through gas outlet 24 is cooled, has almost no SiO content, and has reduced $SiO_2$ and SiC content in comparison with the untreated discharge gas. The treated discharge gas stream may be monitored, further treated, or discharged to the environment. Similarly, the water slurry containing water, $SiO_2$ solids, and SiC solids is removed from the treatment apparatus and may be further tested, treated, or disposed of.

As shown above, the instant invention provides for the safe treatment of discharged gas from a CZ chamber with water without the possibility of a standing volume of water being sucked back into the CZ chamber upon equipment failure. The invention does not rely upon auxiliary safety equipment to prevent the large volume of water from being suctioned back into the apparatus upon equipment failure, such as vacuum breakers, auxiliary tanks, or safety valves. Instead, the invention provides a relatively fail safe apparatus that avoids the use of standing water in communication with the CZ chamber altogether.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method of treating discharge gas from a Czochralski crystal growing process, said method comprising:
   receiving discharge gas from a Czochralski crystal growing chamber; and,
   intimately contacting the discharge gas with a spray of water droplets, wherein the intimate contact of the discharge gas with the spray water droplets comprises cooling the discharge gas;
   reacting SiO from the discharge gas with O2 in the water spray to form $SiO_2$; and
   precipitating $SiO_2$ out of the discharge gas.

2. A method according to claim 1, wherein the discharge gas is received through an inlet in the upper region of a vessel.

3. A method according to claim 2, wherein the discharge gas is projected about the inside of the vessel as it is received through the inlet in the upper region of the vessel.

4. A method according to claim 3, wherein intimately contacting the discharge gas with the spray of water droplets comprises projecting a well dispersed quantity of water about the inside of the vessel and allowing the discharge gas and dispersed water within the reactor to intermingle.

5. A method according to claim 4, further comprising exhausting the contacted discharge gas from the vessel through an outlet.

6. A method according to claim 5, wherein the contacted discharge gas is exhausted from an outlet in the upper region of the vessel and wherein the quantity of well dispersed water is projected downward and inward into the vessel from a source located about the periphery of the upper region of the vessel.

7. A method according to claim 1 further comprising collecting and discharging any accumulation.

8. A method according to claim 7, further comprising agitating the accumulation to facilitate ready collection and discharge of the accumulation.

9. A method according to claim 1, further comprising:
   collecting the solid $SiO_2$; and,
   exhausting the cooled discharge gas to the atmosphere.

10. A method according to claim 1, further comprising exhausting the discharge gas for further gas treatment.

11. An apparatus for producing a crystal by the Czochralski method, comprising:
    a chamber in which the crystal is formed; and
    an exhaust system for discharging gas from the chamber to the atmosphere, said exhaust system having a water spray subsystem, wherein said water spray subsystem comprises a water spray body for spraying water into the discharge gas to thereby provide for the intimate contact of the discharge gas with water before the discharge gas is exhausted into the atmosphere.

12. The apparatus according to claim 11, wherein said water spray subsystem further comprises a vessel, said vessel defining a discharge gas inlet and a discharge gas outlet;

a water spray body; and at least one water outlet for removing water and particulates from the vessel;

wherein the particulates are formed by the contact of water with the discharge gas and wherein said spray body is disposed within the vessel.

13. The apparatus according to claim 12, wherein said vessel has an upper region, and said upper region has a central area and a periphery.

14. The apparatus according to claim 13, wherein said discharge gas inlet projects said discharge gas from the central area of the upper region of the vessel towards a lower region of the vessel.

15. The apparatus according to claim 14, wherein said water spray body is disposed around the periphery of the upper region of the vessel.

16. The apparatus according to claim 15, wherein said water spray body comprises a series of spray nozzles evenly spaced about the periphery of the upper region of the vessel.

17. The apparatus according to claim 16, wherein the series of spray nozzles comprises four nozzles.

18. The apparatus according to claim 16, wherein the discharge gas outlet is located at a point about the periphery of the upper region of the vessel.

19. The apparatus according to claim 18, wherein said at least one water outlet comprises a first drain disposed in the lower region of the vessel.

20. The apparatus according to claim 19, wherein said at least one water outlet further comprises an agitator for encouraging particulated solids to flow out of said drain with the water.

21. The apparatus according to claim 19, wherein said at least one water outlet further comprises a second drain disposed between the first drain and the discharge gas inlet, such that any excess accumulation not removed by the first drain is removed by the second drain before reaching the level of the discharge gas inlet.

22. A discharge gas treatment subsystem for use with a Czochralski crystal growing chamber, comprising a vessel having a discharge gas inlet for receiving discharge gas from the CZ chamber;

a discharge gas outlet for exhausting the discharge gas to the atmosphere or for further treatment;

a water spray body for projecting a dispersed water spray about the vessel; and at least one water outlet for removing water and particulates from the vessel, wherein the particulates are formed by the contact of water with the discharge gas.

23. The treatment subsystem according to claim 22, wherein said vessel has an upper region having a central area and a periphery.

24. The treatment subsystem according to claim 23, wherein said discharge gas inlet projects said discharge gas from the central area of the upper region of the vessel towards a lower region of the vessel.

25. The treatment subsystem according to claim 24, wherein said water spray body is disposed around the periphery of the upper region of the vessel.

26. The treatment subsystem according to claim 25, wherein said water spray body comprises a series of spray nozzles evenly spaced about the periphery of the upper region of the vessel.

27. The treatment subsystem according to claim 26, wherein the series of spray nozzles comprises four nozzles.

28. The treatment subsystem according to claim 26, wherein the discharge gas outlet is located at a point about the periphery of the upper region of the vessel.

29. The treatment subsystem according to claim 28, wherein said at least one water outlet comprises a first drain disposed in the lower region of the vessel.

30. The treatment subsystem according to claim 29, wherein said at least one water outlet further comprises an agitator for encouraging particulated solids to flow out of said drain with the water.

31. The treatment subsystem according to claim 29, wherein said at least one water outlet further comprises a second drain disposed between the first drain and the discharge gas inlet, such that any excess accumulation not removed by the first drain is removed by the second drain before reaching the level of the discharge gas inlet.

* * * * *